(12) United States Patent
Tanaka

(10) Patent No.: US 12,546,542 B2
(45) Date of Patent: Feb. 10, 2026

(54) VAPOR CHAMBER AND MANUFACTURING METHOD OF VAPOR CHAMBER

(71) Applicant: FURUKAWA ELECTRIC CO., LTD., Tokyo (JP)

(72) Inventor: Kengo Tanaka, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 228 days.

(21) Appl. No.: 18/252,063

(22) PCT Filed: Nov. 26, 2021

(86) PCT No.: PCT/JP2021/043310
§ 371 (c)(1),
(2) Date: May 8, 2023

(87) PCT Pub. No.: WO2022/114094
PCT Pub. Date: Jun. 2, 2022

(65) Prior Publication Data
US 2024/0011716 A1    Jan. 11, 2024

(30) Foreign Application Priority Data

Nov. 26, 2020 (JP) ................................ 2020-195644

(51) Int. Cl.
*F28D 15/04*   (2006.01)
*F28D 15/02*   (2006.01)
*F28D 21/00*   (2006.01)

(52) U.S. Cl.
CPC ....... *F28D 15/046* (2013.01); *F28D 15/0233* (2013.01); *F28D 2021/0029* (2013.01)

(58) Field of Classification Search
CPC ............... F28D 15/046; F28D 15/0233; F28D 2021/0029; F28D 15/04; F28F 3/048; H01L 23/427; H05K 7/20
(Continued)

(56) References Cited

U.S. PATENT DOCUMENTS 9,835,383 B1 * 12/2017 Roper .................... F28D 15/046
9,854,705 B2 * 12/2017 Honmura ............ F28D 15/0233
(Continued)

FOREIGN PATENT DOCUMENTS

CA       2614471 A1 *  3/2007  ......... F28D 15/0233
CN    111163621 A  *  5/2020  ......... H05K 7/20336
(Continued)

OTHER PUBLICATIONS

JP 2007212028A Machine Translation (Year: 2007).*
International Search Report issued Feb. 1, 2022 in PCT/JP2021/043310 filed on Nov. 26, 2021, 2 pages.

*Primary Examiner* — Len Tran
*Assistant Examiner* — Gustavo A Hincapie Serna
(74) *Attorney, Agent, or Firm* — Oblon, McClelland, Maier & Neustadt, L.L.P.

(57) ABSTRACT

A vapor chamber which enables to raise the heat transfer coefficient by improving the transport efficiency of the working fluid, and a manufacturing method thereof. A vapor chamber includes a working fluid in a sealed internal space formed by joining a first metal sheet and a second metal sheet, in which in an opposite surface of at least one metal sheet (at least opposite surface 12a in FIGS. 1A and 1B) among opposite surfaces 11a, 12a at which the first metal sheet and the second metal sheet are facing each other, main grooves extending continuously or discontinuously towards one direction (extending direction X of main groove) are formed in line at a predetermined interval, and connection grooves connecting main grooves 21a, 21b which are adjacent are formed at irregular arrangement pitches and irregular grooves widths toward a different direction than the one direction (extending direction X of main groove 21).

20 Claims, 8 Drawing Sheets

(58) Field of Classification Search
USPC .................................................. 165/104.26
See application file for complete search history.

(56) References Cited

U.S. PATENT DOCUMENTS

| | | | | |
|---|---|---|---|---|
| 10,959,357 | B2* | 3/2021 | Tamayama | H05K 9/0022 |
| 11,013,145 | B1* | 5/2021 | Naito | F28D 15/046 |
| 11,058,031 | B2* | 7/2021 | Numoto | F28D 15/04 |
| 11,231,235 | B2* | 1/2022 | Wakaoka | F28D 15/0233 |
| 11,473,849 | B2* | 10/2022 | Naito | F28F 3/086 |
| 11,598,594 | B2* | 3/2023 | Lewis | H05K 7/20336 |
| 12,292,238 | B2* | 5/2025 | Abe | F28D 15/0233 |
| 2007/0227704 | A1* | 10/2007 | Nagai | F28D 15/0233 165/104.33 |
| 2008/0216994 | A1 | 9/2008 | Lee | |
| 2009/0159242 | A1* | 6/2009 | Zhao | F28D 15/046 165/104.33 |
| 2013/0126139 | A1* | 5/2013 | Tsuruta | F28F 3/12 165/170 |
| 2013/0269913 | A1* | 10/2013 | Ueda | F28D 15/046 165/104.26 |
| 2016/0209122 | A1* | 7/2016 | Wang | F28D 15/0233 |
| 2017/0023308 | A1* | 1/2017 | Huang | F28F 3/00 |
| 2018/0156545 | A1* | 6/2018 | Delano | F28D 15/043 |
| 2020/0309470 | A1* | 10/2020 | Huang | F28D 15/0283 |
| 2020/0355444 | A1* | 11/2020 | Chen | F28D 15/046 |
| 2020/0404802 | A1* | 12/2020 | Takahashi | B32B 3/30 |
| 2021/0136955 | A1* | 5/2021 | Wakaoka | F28D 15/046 |
| 2021/0180877 | A1* | 6/2021 | Wong | H05K 7/20336 |
| 2021/0215434 | A1* | 7/2021 | Chao | F28F 3/048 |
| 2021/0356212 | A1* | 11/2021 | Naito | F28F 3/086 |
| 2021/0360822 | A1* | 11/2021 | Huang | H05K 7/20336 |
| 2022/0003507 | A1* | 1/2022 | Lee | F28D 15/0233 |
| 2022/0272868 | A1* | 8/2022 | Moon | H04M 1/02 |
| 2022/0279678 | A1* | 9/2022 | Takahashi | H01L 23/427 |
| 2022/0279683 | A1* | 9/2022 | Sun | F28D 15/0233 |
| 2023/0026517 | A1* | 1/2023 | Oda | H05K 7/20336 |
| 2023/0258412 | A1* | 8/2023 | Meng | F28D 15/046 165/104.26 |
| 2023/0266069 | A1* | 8/2023 | Uekubo | F28D 15/04 165/104.26 |
| 2024/0302108 | A1* | 9/2024 | Wong | F28D 15/046 |

FOREIGN PATENT DOCUMENTS

| | | | | |
|---|---|---|---|---|
| CN | 211656735 U | * | 10/2020 | ........... H05K 7/2029 |
| JP | 55-44876 B2 | | 11/1980 | |
| JP | 4-80594 A | | 3/1992 | |
| JP | 2007212028 A | * | 8/2007 | |
| JP | 2019-158323 A | | 9/2019 | |
| JP | 2019196896 A | * | 11/2019 | ........... F28D 15/046 |
| WO | WO-2016114840 A2 | * | 7/2016 | ........... F28D 15/046 |

* cited by examiner

VAPOR CHAMBER AND MANUFACTURING METHOD OF VAPOR CHAMBER

TECHNICAL FIELD

The present disclosure relates to a vapor chamber and a manufacturing method of a vapor chamber.

BACKGROUND ART

Electronic components such as semiconductor elements mounted in electrical/electronic devices such as notebook computers, digital cameras and mobile telephones are in a trend of increasing heat generation amount, due to the high-density mounting accompanying improved performance. In order to correctly operate an electrical/electronic device over a long period, it is necessary to efficiently cool the electronic components. For this reason, inside of an electronic device, a cooling device for cooling a heat generating body such as electronic components is normally installed. As such a cooling device, for example, a vapor chamber using the latent heat (heat of vaporization) by phase changing the working fluid from liquid phase to gas phase has been known.

For example, Patent Document 1 discloses a vapor chamber having a first metal sheet and a second metal sheet, and including a liquid flow passage part in a sealed space provided between the first metal sheet and second metal sheet. The vapor chamber of Patent Document 1 has a first communication groove so as to connect a first main flow groove and a second main flow groove, and has a second communication groove so as to connect the second main flow groove and a third main flow groove. Herein, the width of a first communication groove is larger than the width of a first main flow groove and width of the second main flow groove, and the width of a second communication groove is configured to be larger than the width of a second main flow groove and the width of a third main flow groove. In addition, the depth of the first communication groove is deeper than the depth of the first main flow groove and depth of the second main flow groove, and the depth of the second communication groove is configured deeper than the depth of the second main flow groove and depth of the third main flow groove.

In addition, with the vapor chamber of Patent Document 1, in order to prevent the capillary action in a direction along the main flow groove from being lost, the first communication groove and second communication groove are not arranged on one line, but rather arranged at a regular arrangement pitch shifted by half pitch from each other.

Patent Document 1: Japanese Unexamined Patent Application, Publication No. 2019-158323

DISCLOSURE OF THE INVENTION

Problems to be Solved by the Invention

However, by forming communication grooves having large width and deep depth, the vapor chamber of Patent Document 1 causes the working fluid to accumulate in the communication grooves without disturbing the flow of working fluid, and upon dry-out occurring by the working fluid no longer flowing in the main flow groove, causes the working fluid stored in the communication groove to migrate from the communication groove to the main flow groove.

Regarding this, it has been desired to further improve the cooling performance of a vapor chamber, and for this purpose, it has been desired to configure so as to be able to transport more working fluid in a short time, even in a wide area along a different direction than the extending direction of the main flow groove.

An object of the present invention is to provide a vapor chamber enabling to raise the heat transfer coefficient by improving the transport efficiency of the working fluid, and a manufacturing method thereof.

Means for Solving the Problems

In order to achieve the above object, the essential configuration of the present invention is as follows. A first aspect of the present invention provides a vapor chamber including a working fluid in a sealed internal space formed by joining a first metal sheet and a second metal sheet in which, in an opposite surface of at least one metal sheet among opposite surfaces at which the first metal sheet and the second metal sheet are facing each other, main grooves extending continuously or discontinuously towards one direction are formed in line at a predetermined interval, and connection grooves connecting main grooves which are adjacent are formed at irregular arrangement pitches and irregular grooves widths toward a different direction than the one direction. According to a second aspect of the present invention, the vapor chamber as described in the first aspect further includes an evaporator which evaporates the working fluid, and a condenser arranged at a position separated from the evaporator and which condenses the working fluid, in which at least part of the main grooves configure a flow channel in which the working fluid of liquid phase refluxes from the condenser toward the evaporator, and the internal space configures a flow channel of the working fluid of gas phase from the evaporator toward the condenser. According to a third aspect of the present invention, in the vapor chamber as described in the first or second aspect, an opposite surface of the first metal sheet has a recess partitioning to form the internal space, the second metal sheet is a flat shape at least at the evaporator, and the main grooves are arranged in line at least in an opposite surface of the second metal sheet. According to a fourth aspect of the present invention, in the vapor chamber as described in any one of the first to third aspects, the main groove has a larger groove depth dimension than groove width dimension. According to a fifth aspect of the present invention, in the vapor chamber as described in any one of the first to fourth aspects, a micro-uneven surface having unevenness of a dimension smaller than a groove depth dimension of the main groove is further formed in an inner surface of the main groove, and a portion of the opposite surface of the at least one metal sheet demarcated by the main groove and the connection groove. According to a sixth aspect of the present invention, in the vapor chamber as described in any one of the first to fifth aspects, the main grooves have an arrangement pitch in a range of at least 100 µm and no more than 250 µm. According to a seventh aspect of the present invention, in the vapor chamber as described in any one of the first to sixth aspects, the main groove has a groove width in a range of at least 10 µm and no more than 100 µm, and the main groove has a groove depth in a range of at least 10 µm and no more than 1000 µm. According to an eighth aspect of the present invention, in the vapor chamber as described in any one of the first to seventh aspects, the connection groove has a groove width in a range of at least 5 µm and no more than 100 µm, and the connection groove has a groove depth in a range of at least 10 μm and no more than 1000 μm. According to a ninth aspect of the present invention, in the vapor chamber as described in any one of the first to eighth aspects, the internal space is partitioned into a plurality of vapor flow channels by contact between abutting parts provided in the opposite surfaces of each of the first metal sheet and the second metal sheet, and the main grooves and the connection grooves are arranged in a region at least including the abutting part of the opposite surface of the at least one metal sheet. A tenth aspect of the present invention provides a manufacturing method of the vapor chamber as described in any one of the first to ninth aspects, the method including forming the main grooves and the connection grooves by irradiating a laser beam so as to draw a line in one direction onto the opposite surface of the at least one metal sheet.

Effects of the Invention

According to the present invention, it is possible to provide a vapor chamber enabling to raise the teat transfer coefficient by improving the transport efficiency of the working fluid, and a manufacturing method thereof.

PREFERRED MODE FOR CARRYING OUT THE INVENTION

Next, the vapor chamber according to some embodiments of the present invention will be explained below.

Figure 1A:
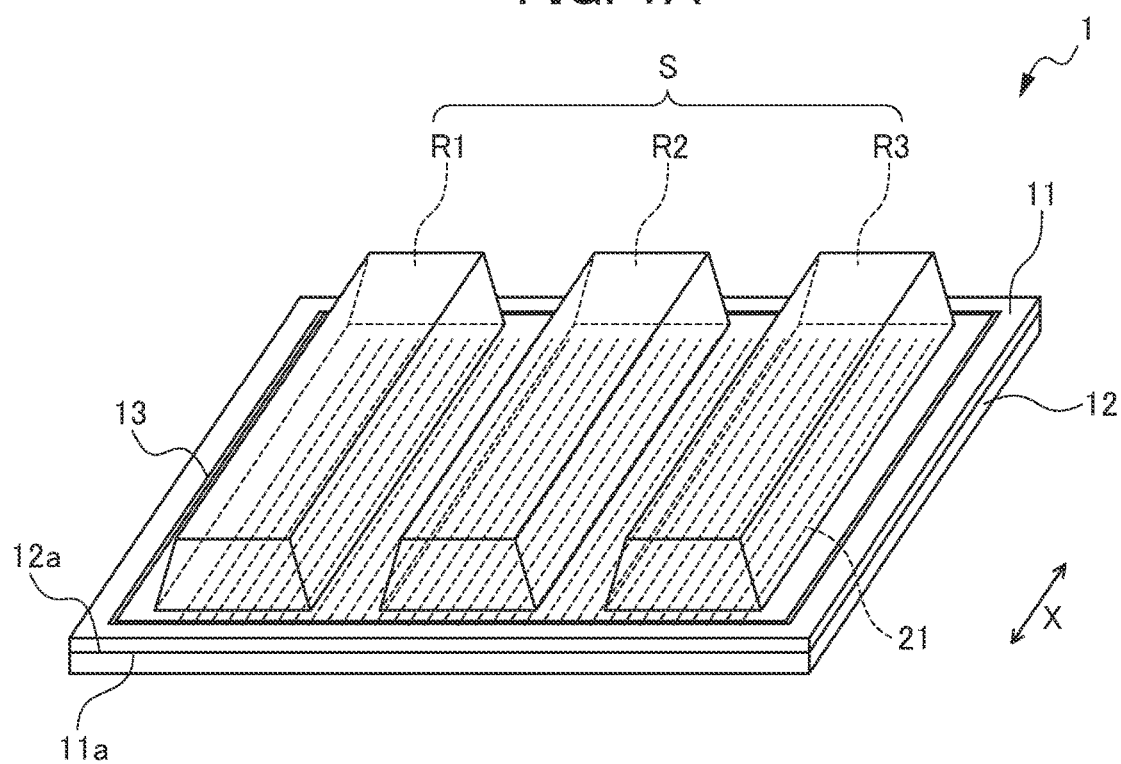
FIGS. 1A and 1B provide views showing the structure of a vapor chamber of a vapor chamber, with FIG. 1A being a perspective view of the vapor chamber, and FIG. 1B being a perspective view of a second metal sheet in which main grooves and connection grooves are formed.
Figure 1B:
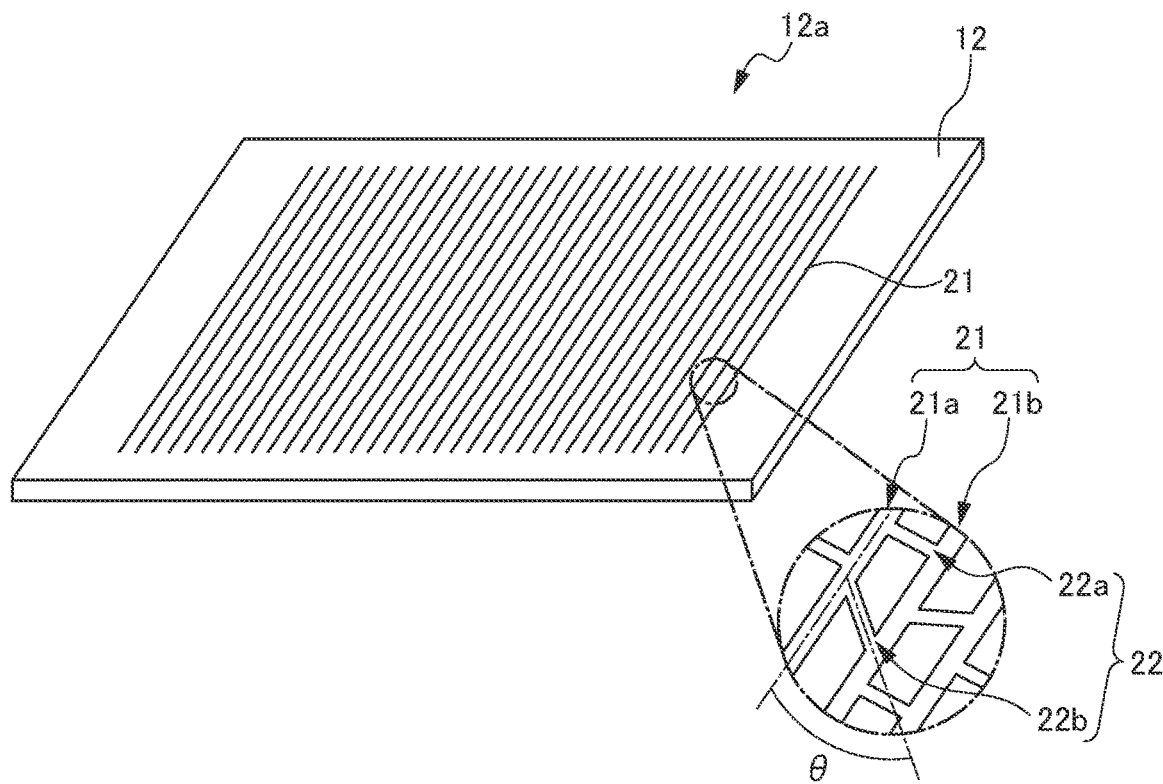
Figure 2:
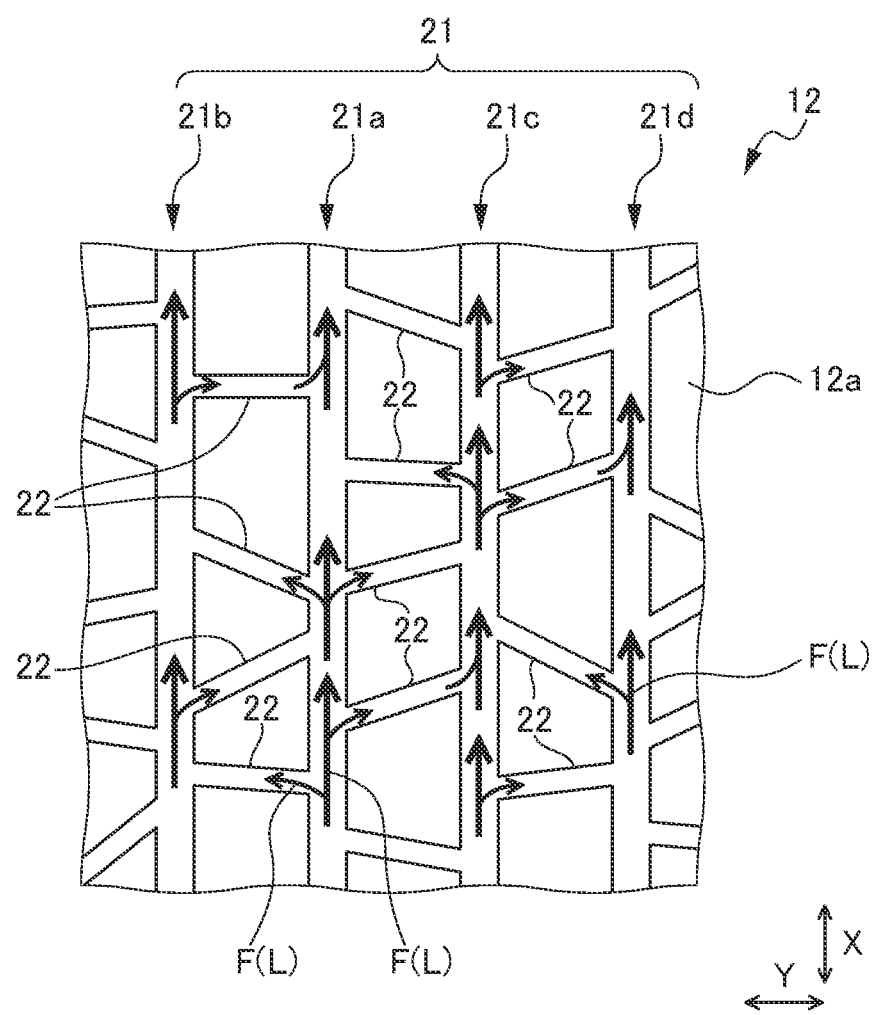
FIG. 2 is a plan view showing principal parts for explaining the flow of working fluid flowing in the main grooves and connection grooves formed in an opposite surface of the second metal sheet shown in FIG. 1B.

FIGS. 1A and 1B provide views showing the structure of a vapor chamber, with FIG. 1A being a perspective view of a vapor chamber, and FIG. 1B being a perspective view of a second metal sheet in which main grooves and connection grooves are formed. FIG. 2 is a plan view showing principal parts for explaining the flow of working fluid flowing in the main grooves and connection grooves formed in an opposite surface of the second metal sheet shown in FIG. 1B. For convenience, FIGS. 1A and 1B show a partly transparent state so that the internal structure of a vapor chamber 1 is understood. In addition, FIG. 2 shows the flow direction of the liquid-phase working fluid $F_L$ by blacked out arrows, and shows the flow direction of the gas-phase working fluid $F_g$ by outlined arrows.

<Vapor Chamber>

The vapor chamber 1 is a vapor chamber 1 having working fluid in a sealed internal space S formed by joining a first metal sheet 11 and second metal sheet 12 as illustrated in FIGS. 1A and 1B, in which main grooves 21 extending continuously or discontinuously towards one direction are formed in line at predetermined intervals in the opposite surface of at least one metal sheet (at least opposite surface 12a in FIGS. 1A and 1B) among the opposite surfaces 11a, 12a at which the first metal sheet 11 and second metal sheet 12 are facing each other, and further, the connection groove 22 connecting adjacent main grooves 21a, 21b are formed at irregular arrangement pitches and irregular groove widths towards a different direction from the aforementioned direction of the main grooves 21. Herein, although the details will be described later, "arrangement pitch" of grooves is an interval including the groove width of a plurality of adjacent grooves for at least the width direction of grooves. In addition, the main grooves 21 and connection grooves 22 are respectively formed at irregular depths.

As illustrated in FIG. 2, the liquid-phase working fluid $F_L$ rapidly flows along the main groove 21 (for example, main groove 21a), and part of the liquid-phase working fluid $F_L$ flowing along the main groove 21 (for example, main groove 21a) branches to the connection groove 22, whereby it comes to flow towards adjacent main grooves 21 in line (for example, main grooves 21b, 21c), and the liquid-phase working fluid $F_L$ flows also along a different direction from the extending direction X of the main groove 21. In particularly, by the connection groove 22 being formed with irregular arrangement pitch and irregular groove width, the vapor chamber 1 can circulate the liquid-phase working fluid $F_L$ along the connection groove 22, even if except for during dry-out, while maintaining rapid flow of the liquid-phase working fluid $F_L$ along the main groove 21, by the liquid-phase working fluid $F_L$ also penetrating into the connection groove 22. In addition, by the connection groove 22 being formed with irregular arrangement pitch and irregular groove width, since the surface area of the portion in which the liquid-phase working fluid $F_L$ circulates by the connection groove 22 increases, it is possible to increase the evaporation surface of the working fluid $F_L$ As a result, since it is possible to efficiently circulate the liquid-phase working fluid $F_L$ in a wider range of the opposite surface in which the main grooves 21 and connection grooves 22 are provided, it is possible to raise the transfer efficiency of latent heat via the vapor chamber 1. Therefore, it is possible to provide a vapor chamber enabling to raise the heat transfer coefficient by improving the transport efficiency of the working fluid, and a manufacturing method thereof.

The vapor chamber 1 of the present embodiment has a working fluid in a sealed internal space S formed by joining the first metal sheet 11 and second metal sheet 12, as illustrated in FIG. 1A. Herein, the first metal sheet 11 and second metal sheet 12 respectively have the opposite surfaces 11a, 12c which are facing each other, and by joining so that the opposite surface 11a of the first metal sheet 11 and the opposite surface 12a of the second metal sheet 12 are opposing, the sealed internal space S is formed by the first metal sheet 11 and second metal sheet 12. The working fluid is enclosed in the internal space S provided inside of the vapor chamber 1.

As the working fluid enclosed in the internal space S, pure water, ethanol, methanol, acetone, etc. can be exemplified from the viewpoint of cooling performance of the vapor chamber 1.

Furthermore, in the first metal sheet 11 and second metal sheet 12 constituting the vapor chamber 1, the main grooves 21 and connection grooves 22 are formed in the opposite surface of at least one metal sheet (opposite surface 12a in FIG. 1B) among the opposite surfaces 11a, 12a facing each other as shown in FIG. 1B.

Configuration of Main Groove

The main groove 21 extends continuously or discontinuously towards on direction, and formed in parallel at predetermined intervals, in the opposite surface of at least one metal surface (opposite surface 12a in FIG. 1B) among the opposite surfaces 11a, 12a of the first metal sheet 11 and second metal sheet 12. Herein, the main groove 21 may be arranged in a linear form along the extending direction X as shown in FIGS. 1A and 1B, but may be arranged in a state at least partially curved. For this reason, "toward one direction" indicates a state in which the entirety of the main groove 21 constitutes the flow channel of the liquid-phase working fluid $F_L$ toward the one direction. In addition, the plurality of main grooves 21 arranged in line are preferably arranged in parallel from the viewpoint of facilitating formation of the connection grooves 22 described later; however, they may be arranged to partially separate.

Figure 3:
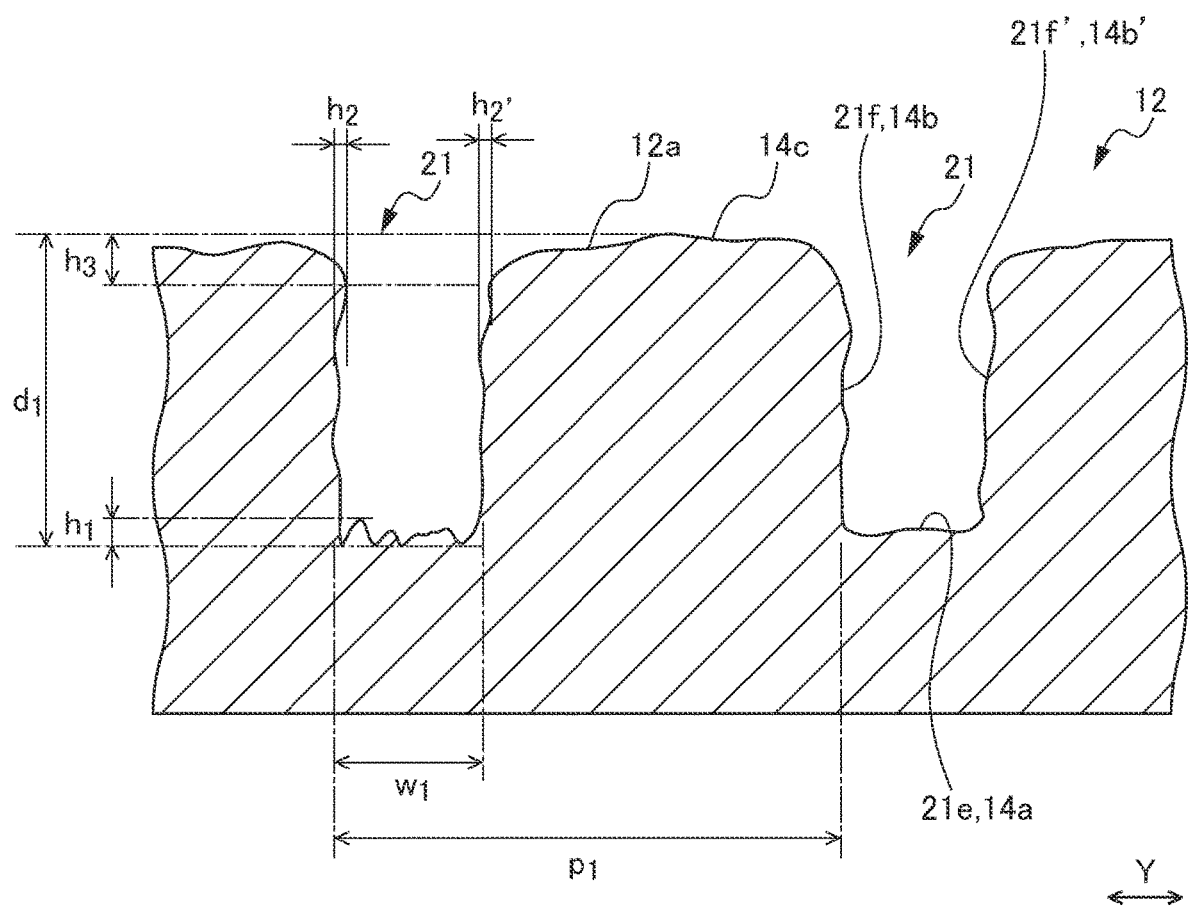
FIG. 3 is a cross-sectional view along a groove width direction of the main groove, showing principal parts for explaining a groove depth dimension, groove width dimension and arrangement pitch of a main groove formed in the opposite surface of the second metal sheet shown in FIG. 1B.

FIG. 3 is a cross-sectional view along a groove width direction of the main groove, showing principal parts for explaining the groove depth dimension, groove width dimension and arrangement pitch of main grooves formed in the opposite surface of the second metal sheet shown in FIG. 1B. Herein, the groove width direction Y of the main groove 21 particularly indicates a direction intersecting at a right angle with the extending direction of the main groove 21, among the directions crossing the main groove 21. In particular, as shown in FIGS. 1A and 1B, in the case of the main groove 21 being arranged linearly along the extending direction X, the groove width direction Y of the main groove 21 indicates a direction intersecting at a right angle with the extending direction X.

As shown in FIG. 3, the groove depth dimension $d_1$ of the main groove 21 is preferably configured to become larger than the groove width dimension $w_1$ of the main groove 21. By the capillary force acting upon the liquid-phase working fluid $F_L$ contacting the main groove 21 becoming stronger, the liquid-phase working fluid $F_L$ tends to circulate rapidly in the main groove 21. For this reason, even in a case of the connection grooves 22 being arranged on both sides of the same position of the main groove 21, it is possible to more efficiently circulate the liquid-phase working fluid $F_L$ along the main groove 21, and branch a part thereof to the connection groove 22. As a result thereof, it is possible to efficiently circulate the liquid-phase working fluid $F_L$ in a wider range of the opposite surface in which the main groove 21 and connection groove 22 are provided.

The groove depth dimension $d_1$ of the main groove 21 is preferably a range of at least 10 μm and no more than 1000 μm, more preferably a range of at least 50 μm and no more than 1000 μm, and even more preferably a range of at least 100 μm and no more than 1000 μm. In addition, the groove width dimension $w_1$ of the main groove 21 is preferably a range of at least 10 μm and no more than 100 μm, more preferably a range of at least 10 μm and no more than 50 μm, and even more preferably a range of at least 10 μm and no more than 30 μm. In addition, the ratio ($d_1/w_1$) of the groove depth dimension $d_1$ to the groove width dimension $w_1$ of the main groove 21 is preferably a range greater than 1.0 and no more than 5.0, and more preferably a range of at least 2.0 and no more than 3.0. According to a main groove 21 having such a shape in which the groove depth dimension $d_1$ is large and the groove width dimension $w_1$ is small, since the capillary phenomenon of the main groove 21 tends to act on the liquid-phase working fluid $F_L$, it is possible to promote the circulation of the liquid-phase working fluid $F_L$ to the main groove 21. In addition, by achieving both a small groove width dimension $w_1$ and large groove depth dimension $d_1$ for the main groove 21, the capillary force of the main groove 21 increases, whereby the flowrate of the liquid-phase working fluid $F_L$ circulating in the main groove 21 also becomes larger. As a result thereof, irrespective of the posture of the vapor chamber 1 or the electronic device equipped with the vapor chamber 1, since it is possible to transport the liquid-phase working fluid $F_L$ farther, it is possible to more stably raise the heat transport performance of the vapor chamber 1.

Herein, the groove depth dimension $d_1$ of the main groove 21 is a distance from the highest portion of the opposite surface (opposite surface 12a in FIG. 3) adjacent to the main groove 21, until the lowest portion of the groove bottom 21e of the main groove 21. In addition, the width groove dimension $w_1$ of the main groove 21 is the shortest distance between the inner wall surface 21f and inner wall surface 21f', which are opposing inner wall surfaces of the main groove 21. The groove depth dimension $d_1$ and groove width dimension $w_1$ of the main groove 21 can be obtained using an optical microscope image when cutting the vapor chamber 1 along the groove width direction Y of the main groove 21.

As the means for forming such a main groove 21 such that the groove depth dimension $d_1$ is larger than the groove width dimension $w_1$, processing using lasers is preferable, and thereamong, processing using a fiber laser is more preferable. In processing by laser, it is possible to form the main groove 21 such that the groove depth dimension $d_1$ is greater than the groove width dimension $w_1$ in a short time. On the other hand, in etching processing using the etchant adopted in conventional vapor chamber, the groove depth dimension $d_1$ has been smaller than the groove width dimension $w_1$.

In the main groove 21, the arrangement pitch $p_1$ of a plurality of adjacent main grooves 21 is preferably a range of at least 100 μm and no more than 250 μm, more preferably a range of at least 150 μm and no more than 250 μm, and even more preferably a range of at least 150 μm and no more than 200 μm. Herein, the arrangement pitch $p_1$ of main grooves 21 is the distance between center lines of the groove width of adjacent main grooves 21. By setting the arrangement pitch $p_1$ of the main grooves 21 to the range of at least 100 μm and no more than 250 μm, since the desired mechanical strength is obtained in the wall surface of the main groove 21, and the processing areas having unevenness are formed adjacent to each other by laser processing upon forming the main grooves 21, it is possible to form recesses in the processing area connected by adjacent portions, and thereby easily form the connection groove 22. In addition, by the amount of liquid-phase working fluid $F_L$ per unit area being abundant, since dry-out in which working fluid vanishes on the opposite surface in which the main groove 21 is formed hardly occurs, it is possible to improve the thermal transport property of the vapor chamber 1.

Configuration of Connection Groove

The connection groove 22 is formed in the opposite surface (opposite surface 12a in FIG. 1B) in which the main groove 21 is formed, among the opposite surfaces 11a and 12a, as shown in FIG. 1B. Herein, the connection groove 22 is formed so as to connect at least two adjacent main grooves 21a, 21b with an irregular arrangement pitch and irregular groove width, towards a different direction than the extending direction X of the main groove (different direction than the aforementioned one direction). By the capillary force becoming stronger when configuring the groove serving as the path in which the liquid-phase working fluid $F_L$ circulates with a small groove width and large groove depth, since the flowrate of the liquid-phase working fluid $F_L$ increases, it is possible to efficiently circulate the liquid-phase working fluid $F_L$. On the other hand, in the case of making the groove width small, since the opening area of the groove decreases, the evaporation surface of the working fluid F tends to decrease. In this regard, with the vapor chamber 1, by the connection groove 22 being formed with an irregular arrangement pitch and irregular groove width, since the main grooves 21 are connected with each other by the connection grooves 22, it is also possible to increase the flowrate of the liquid-phase working fluid $F_L$ by the capillary force of the connection groove 22. Together with this, by the liquid-phase working fluid $F_L$ also penetrating the connection grooves 22, it is possible to raise the heat transport performance of the vapor chamber 1 due to increasing the evaporation surface of the working fluid $F_L$. Therefore, by such a connection groove 22 in the vapor chamber 1, since it is possible to circulate the liquid-phase working fluid $F_L$ along the main groove 21, and branch a part thereof to the connection groove 22, as well as being able to increase the evaporation surface of the working fluid $F_L$ it is possible to efficiently circulate the liquid-phase working fluid $F_L$ in a wider range of the opposite surface in which the main grooves 21 and connection grooves 22 are provided. Furthermore, when the connection groove 22 is provided to an evaporator 3 described later, the evaporation surface of the working fluid of the evaporator 3 increases, and the evaporation amount of the working fluid increases. As a result thereof, it is possible to make dry-out of the vapor chamber 1 hardly occur and improve the thermal transport property.

The connection grooves 22 are formed with an irregular arrangement pitch and irregular groove width $w_2$. At this time, for the connection groove 22, the angle θ relative to the direction in which the main groove 21 extends (extending direction X of main groove 21) may differ as shown in FIG. 1B. In addition, the connection grooves 22 may be formed irregularly also for the groove depth dimension $d_2$, in addition to the arrangement pitch and groove width dimension $w_2$. It should be noted that the connection grooves 22 being "formed irregularly" for the arrangement pitch refers to the standard deviation of the arrangement pitch being at least 10% relative to the average value of the arrangement pitch, when obtaining the arrangement pitch between adjacent connection grooves 22 by the average of both ends, for all connection grooves 22 which are within the range of 10 mm height×10 mm width, among the surfaces in which the connection groove 22 is formed. In addition, the connection groove 22 being "irregularly formed" for the groove width dimension $w_2$ or groove depth dimension $d_2$ refers to the standard deviation of the sought dimension being at least 10% relative to the average value of the sought dimension, when seeking the groove width dimension $w_2$ or groove depth dimension $d_2$ for all connection grooves 22 which are within an area of 10 mm height and 10 mm width, in the surface in which the connection groove 22 is formed.

Figure 4:
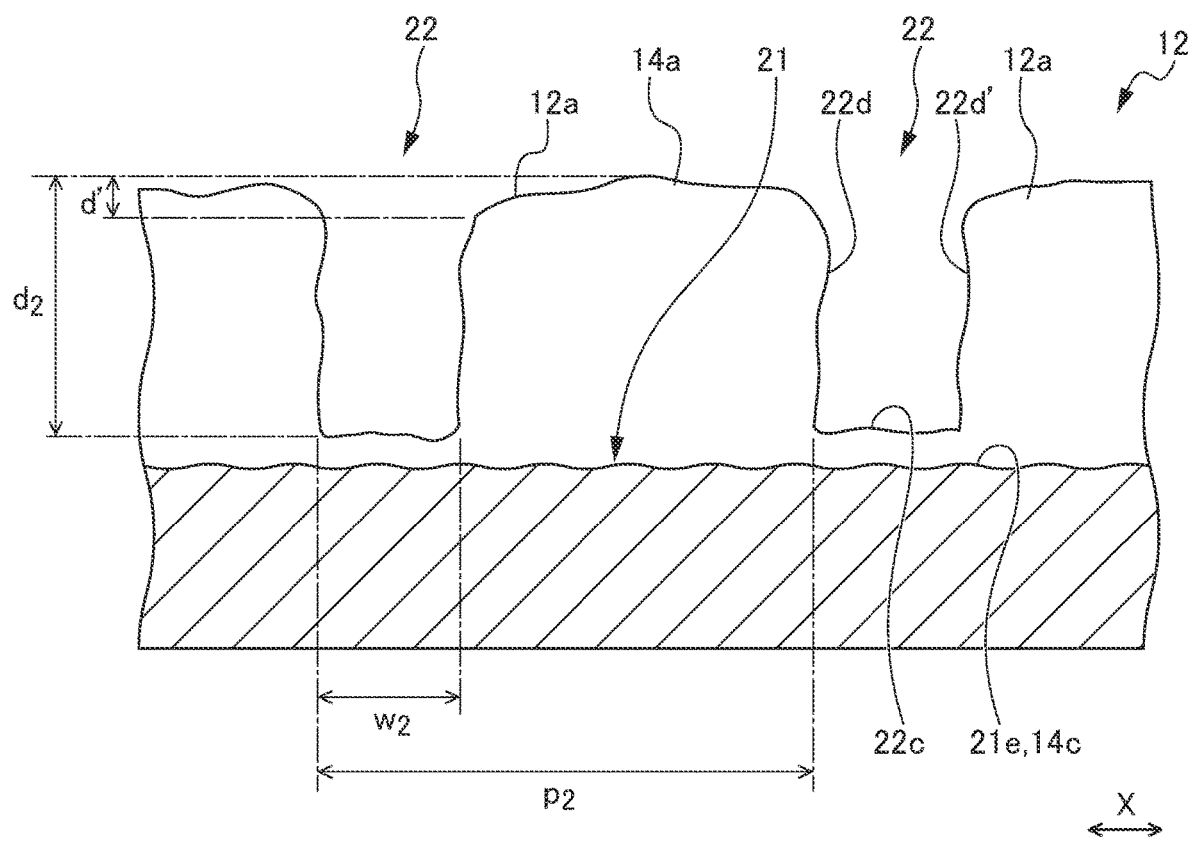
FIG. 4 is a cross-sectional view along a groove width direction of the connection groove, showing principal parts for explaining a groove depth dimension, groove width dimension and arrangement pitch of a connection groove formed in the opposite surface of the second metal sheet shown in FIG. 1B.

FIG. 4 is a cross-sectional view along the groove width direction of the connection groove showing principal parts for explaining the groove depth dimension, groove width dimension and arrangement pitch of the connection grooves formed in the opposite surface of the second metal sheet shown in FIG. 1B. It should be noted that the cross-sectional view of FIG. 4 illustrates a cross section along the extending direction of the main groove; however, the groove width direction of the connection groove and the extending direction of the main groove may be different directions.

As shown in FIG. 4, the groove depth dimension $d_2$ of the connection groove 22 is preferably the same as the groove depth dimension $d_2$ of the main groove 21, or smaller than the groove depth dimension $d_2$ of the main groove 21, from the viewpoint of promoting flow of the liquid-phase working fluid $F_L$ along the main groove 21. Herein, the groove depth dimension $d_2$ of the connection groove 22 is preferably a range of at least 10 μm and no more than 1000 μm, and more preferably a range of at least 50 μm and no more than 500 μm.

In addition, the groove width dimension $w_2$ of the connection groove 22 is preferably a range of at least 5 μm and no more than 100 μm, and more preferably a range of at least 10 μm and no more than 50 μm. In particular, from viewpoint of making the capillary force acting on the liquid-phase working fluid $F_L$ by the connection groove 22 weaker than the capillary action acting on the liquid-phase working fluid $F_L$ by the main groove 21, and the promoting circulation of the liquid-phase working fluid $F_L$ along the main groove 21, the groove width dimension $w_2$ of the connection groove 22 is preferably equal to the groove width dimension $w_1$ of the main groove 21, or greater than the groove width dimension $w_1$ of the main groove 21.

A groove having large groove width dimension $w_2$ (or groove portion) among the connection grooves 22 formed in the vapor chamber 1 can contribute to an improvement in heat transport performance by an increase in evaporation surface. In addition, a groove having a small groove width dimension $w_2$ (or groove portion) among the connection grooves 22 formed in the vapor chamber 1 can contribute to an increase in flowrate of the liquid-phase working fluid $F_L$ by capillary force.

Herein, the groove depth dimension $d_2$ of the connection groove 22 is the distance from the highest portion of the opposite surface adjacent to the connection groove 22 (opposite surface 12a in FIG. 4), until the lowest portion of the groove bottom 22c of the connection groove 22. In addition, the groove width dimension $w_2$ of the connection groove 22 is the shortest distance between the inner wall surface 22d and inner wall surface 22d', which are opposing inner wall surfaces of the connection groove 22. The groove depth dimension $d_2$ and groove width dimension $w_2$ of the connection groove 22 are measured by photographing a cross section when cutting the vapor chamber 1 along a direction horizontally traversing the connection groove 22 by a camera or the like, and analyzing the image obtained by photography.

As the means for forming such a connection groove 22, processing using lasers is preferable, and thereamong, processing using a fiber laser is more preferable. Upon forming adjacent main grooves 21 with processing by laser, by adjoining processing areas having unevenness formed by laser processing, it is possible to simultaneously form the main grooves 21 and connection grooves 22.

Configuration of Micro-Uneven Surface

In the vapor chamber 1 of the present embodiment, as shown in FIG. 3, micro-uneven surfaces 14a, 14b, 14b' having unevenness of a dimension smaller than the groove depth dimension $d_1$ of the main groove 21 are preferably formed in a portion of the inner surface of the main groove 21. More specifically, in the vapor chamber 1, the micro-uneven surfaces 14a, 14b, 14b' having unevenness of height dimensions $h_1$, $h_2$, $h_2'$ smaller than the groove depth dimension $d_1$ of the main groove 21 are preferably formed in at least any of the groove bottom 21e, inner wall surface 21f and inner wall surface 21f' of the main groove 21. In addition to the capillary phenomenon of the main groove 21 and connection groove 22, the capillary phenomenon also occurs by contact between the micro-uneven surfaces 14a, 14b, 14b' which are the inner surfaces of the main groove 21 and the liquid-phase working fluid $F_L$, and the liquid-phase working fluid $F_L$ spreads in a wider range of the inner surface of the main groove 21, whereby it is possible to reflux more of the liquid-phase working fluid $F_L$. In addition, by the liquid-phase working fluid $F_L$ tending to be retained on the inner surface of the main groove 21, it is possible to promote the circulation of the liquid-phase working fluid $F_L$ to the inner surface of the main groove 21. Therefore, by the micro-uneven surfaces 14a, 14b, 14b' being formed, it is possible to make dry-out of the vapor chamber 1 more unlikely to occur, and possible to further improve the thermal transport property of the vapor chamber 1.

In addition, in the vapor chamber 1 of the present embodiment, as shown in FIGS. 3 and 4, the micro-uneven surface 14c having unevenness of height dimension $h_3$ smaller than the groove depth dimension $d_1$ of the main groove 21 is preferably formed in a portion of the opposite surface of at least one metal sheet (opposite surface 12a in FIGS. 3 and 4) divided by the main groove 21 and connection groove 22. Since it is possible to reflux more of the liquid-phase working fluid $F_L$ by the capillary force acting by contact between the micro-uneven surface 14c which is the opposite surface and the liquid-phase working fluid $F_L$, and the liquid-phase working fluid $F_L$ being introduced to the main groove 21 and/or connection groove 22, it is thereby possible to make dry-out of the vapor chamber 1 more unlikely to occur.

Herein, the height dimensions $h_1$, $h_2$, $h_2'$, $h_3$ of the micro-uneven surfaces 14a, 14b, 14b', 14c are each preferably the range of 0.1 μm and no more than 10 μm, and more preferably the range of 1 μm and no more than 5 μm.

Such micro-uneven surfaces 14a, 14b, 14b', 14c can be formed by processing using lasers. More specifically, it is possible to use the processing region having unevenness formed by laser processing on the inner surface of the main groove 21 as the micro-uneven surfaces 14a, 14b, 14b' of the main groove 21 as is. In addition, it is possible to use the processing region having unevenness formed in the vicinity of the opening of the main groove 21 as a part or entirety of the micro-uneven surface 14c of the opposite surface.

Configurations of Evaporator and Condenser

Figure 5A:
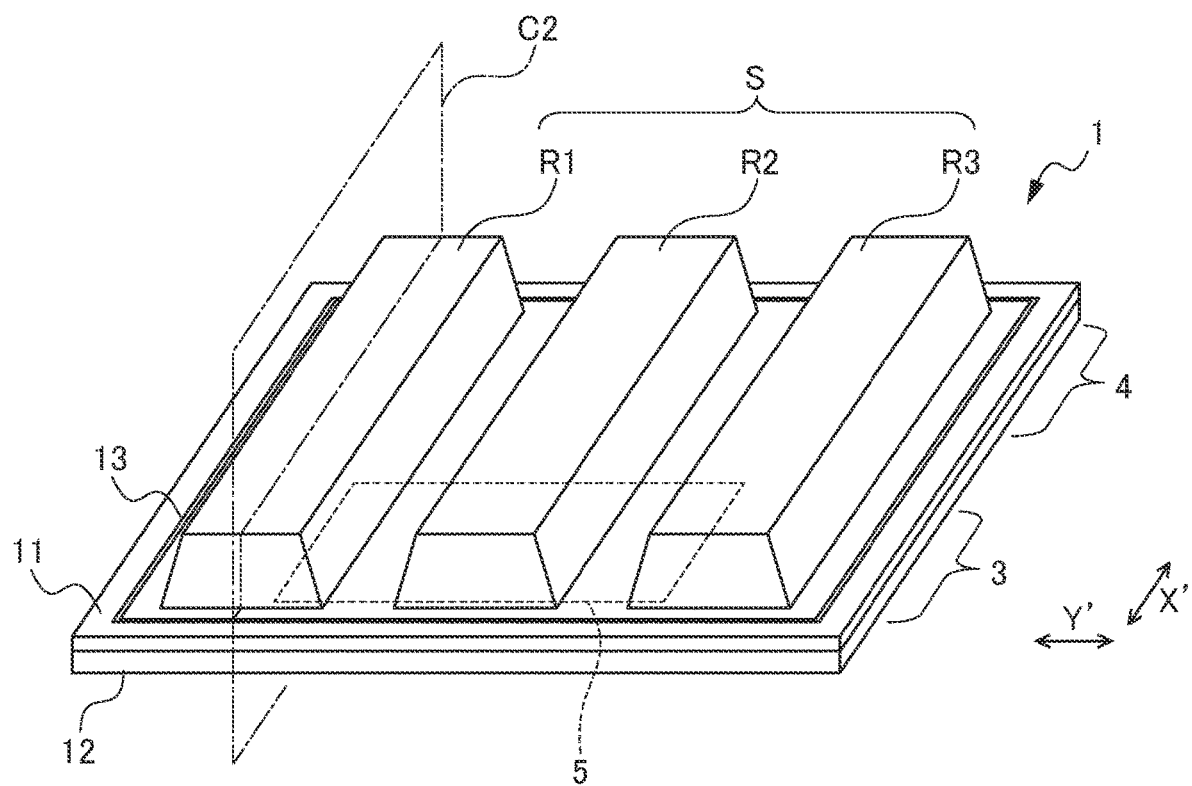
FIGS. 5A and 5B provide views showing flow channels of the working fluid in the vapor chamber overall, with FIG. 5A being a perspective view, and FIG. 5B being a cross-sectional view in a virtual plane $C_1$ including an extending direction of an internal space shown in FIG. 5A.
Figure 5B:
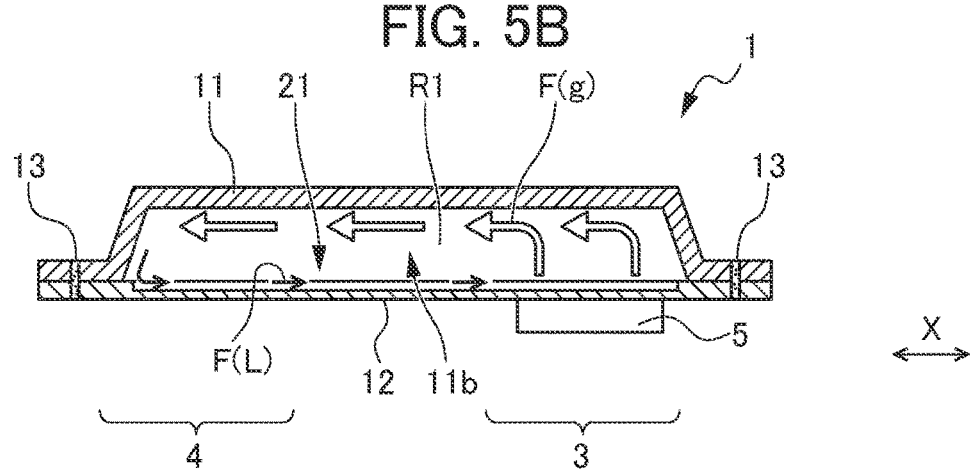

FIGS. 5A and 5B provide views showing the flow channels of the working fluid in the vapor chamber overall, with FIG. 5A being a perspective view, and FIG. 5B being a cross-sectional view of a virtual plane $C_1$ including the extending direction X' of the internal space shown in FIG. 5A. FIGS. 5A and 5B show the flow direction of the liquid-phase working fluid $F_L$ by blacked out arrows, and shows the flow direction of the gas-phase working fluid $F_g$ by outlined arrows.

The vapor chamber 1 of the present embodiment includes: an evaporator 3 which evaporates the liquid-phase working fluid $F_L$ to phase change to the gas-phase working fluid $F_g$; and the condenser 4 arranged at a position separated from the evaporator 3, and which condenses the gas-phase working fluid $F_g$ to phase change to the liquid-phase working fluid $F_L$, as shown in FIG. 5A.

Thereamong, the evaporator 3 is arranged at one end side portion of the vapor chamber 1 in FIGS. 5A and 5B. This evaporator 3 has a function of receiving heat (absorbing heat) from a heat generating body 5 thermally connected thereto. More specifically, the evaporator 3 absorbs the heat received from the heat generating body 5 as latent heat of vaporization, by evaporating the liquid-phase working fluid $F_L$ to phase change to the gas-phase working fluid $F_g$, as illustrated in FIG. 5B. Herein, the heat generating body 5 is a member such as an electronic component which generates heat during operation, such as a semiconductor element, for example.

In addition, the condenser 4 is arranged at a position separated from the evaporator, and is arranged at the other end side portion of the vapor chamber 1 in FIGS. 5A and 5B. This condenser 4 has a function of radiating the gas-phase working fluid $F_g$ having been phase changed by the evaporator 3 and transported. More specifically, the condenser 4 condenses the gas-phase working fluid $F_g$ to phase change to the liquid-phase working fluid $F_L$, thereby releasing the heat of the transported working fluid $F_g$ as latent heat of condensation to outside of the vapor chamber 1.

With the vapor chamber 1 of the present embodiment, transport of the liquid-phase working fluid $F_L$ from the condenser 4 to the evaporator 3 is performed in the vicinity of the opposite surfaces 11a, 12a in which the main grooves 21 and connection grooves 22 are provided. On the other hand, the transport of the gas-phase working fluid $F_g$ from the evaporator 3 to the condenser 4 is mainly performed at a portion of the internal space S in which the main grooves 21 and connection grooves 22 are not provided.

At this time, at least part of the main grooves 21 preferably constitute a flow channel in which the liquid-phase working fluid $F_L$ refluxes from the condenser 4 towards the evaporator 3. Herein, at least part of the main grooves 21 is preferably provided at a lower side of the internal space S. On the other hand, the internal space S preferably constitutes a flow channel of the gas-phase working fluid $F_g$ extending in the extending direction X' from the evaporator 3 towards the condenser 4. By configuring the vapor chamber 1 in this way, the liquid-phase working fluid $F_L$ efficiently circulates from the condenser 4 to the evaporator 3 via the main grooves 21 extending towards the extending direction X, and the connection grooves 22 formed in a different direction than the extending direction X of the main grooves 21. In addition, the gas-phase working fluid $F_g$ flows from the evaporator 3 to the condenser 4 via the internal space S which is on the upper side of the main groove 21 in which the liquid-phase working fluid $F_L$ flows. As a result thereof, it is possible to make dry-out of the vapor chamber 1 hardly occur and improve the thermal transport property.

Configurations of First Metal Sheet and Second Metal Sheet

Figure 6A:
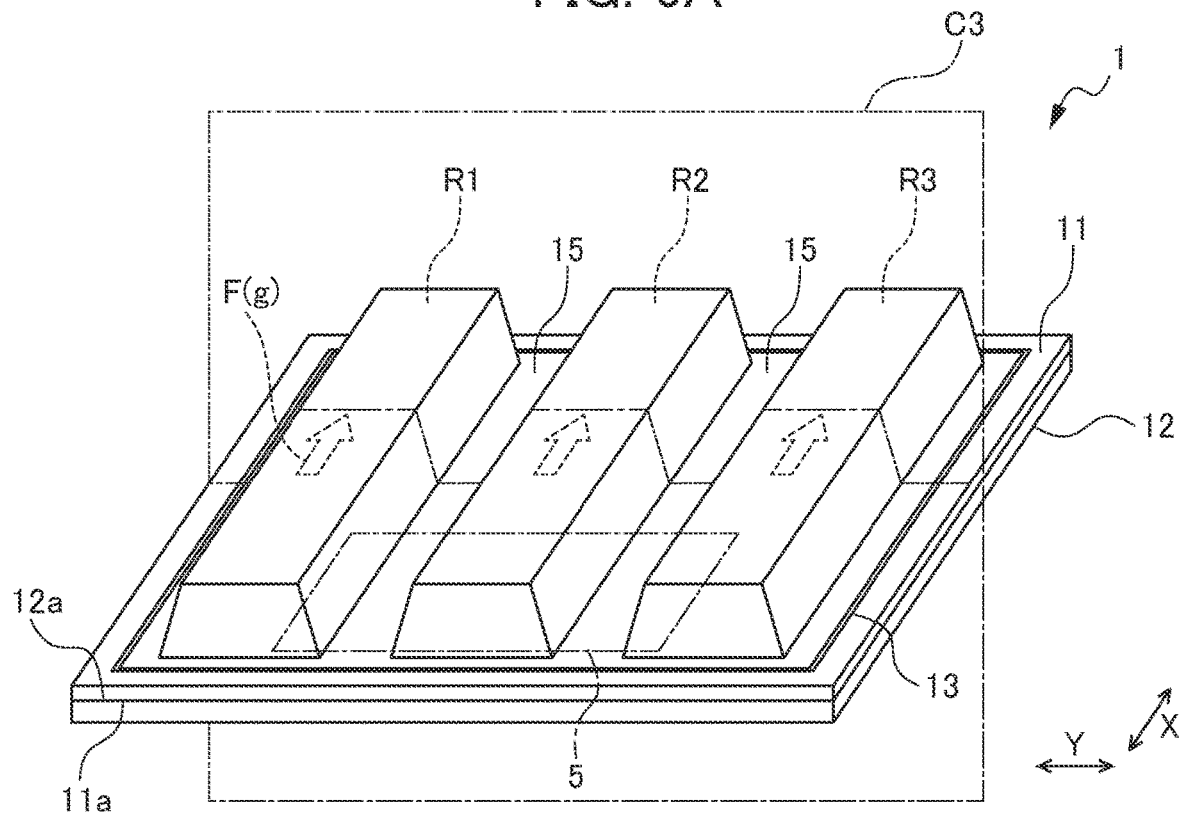
FIGS. 6A and 6B provide views shown so that a positional relationship of abutting parts formed in the opposite surfaces of each of the first and second metal sheets constituting the vapor chamber along with the main groove and connection groove is understood, with FIG. 6A being a perspective view, and FIG. 6B being a cross-sectional view in a virtual plane $C_2$ including the width direction of the internal space shown in FIG. 6A.
Figure 6B:
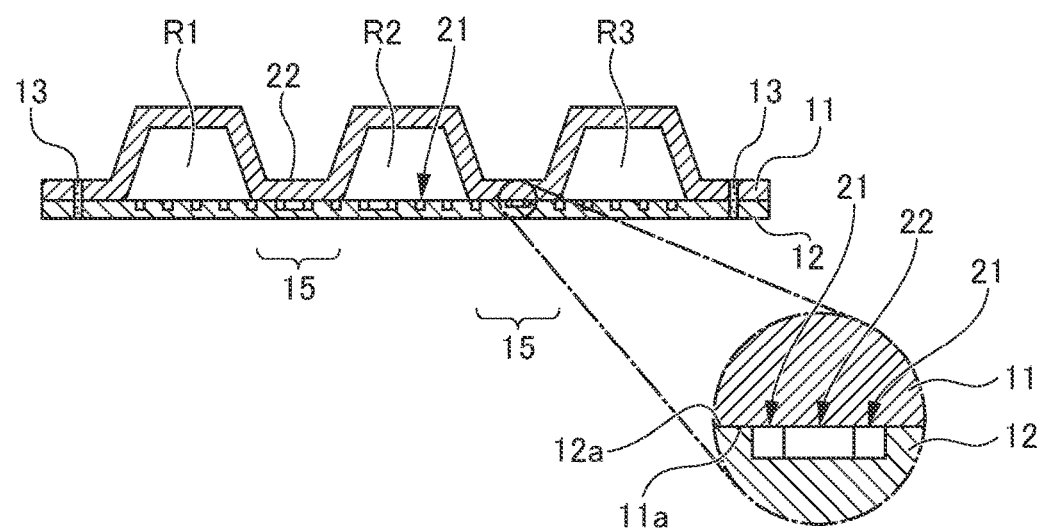

FIGS. 6A and 6B provide views shown so that a positional relationship of abutting parts formed in the opposite surfaces of each of the first metal sheet 11 and second metal sheet 12 of the vapor chamber along with the main grooves and connection grooves is understood, with FIG. 6A being a perspective view, and FIG. 6B being a cross-sectional view in a virtual plane $C_2$ including the width direction Y' of the internal space shown in FIG. 6A.

The first metal sheet 11 and second metal sheet 12 constituting the vapor chamber 1 of the present embodiment configure a sealed internal space S by the opposite surfaces 11a, 12a which are facing each other. For this reason, the shape of at least one among the first metal sheet 11 and second metal sheet 12 is a shape including a recess that partitions to form the internal space S.

Herein, the shape of one among the first metal sheet 11 and second metal sheet 12 may be a flat shape. For example, as shown in FIG. 5A, it is preferable for the opposite surface 11a of the first metal sheet 11 to have a recess 11b partitioning to form the internal space S, and the opposite surface 12a of the second metal sheet 12 to have a flat shape in at least the evaporator 3. At this time, the main grooves 21 are preferable arranged in line in the opposite surface 12a of the second metal sheet 12. Heat is efficiently transferred from the heat generating body 5 to the evaporator 3 of flat shape, and the liquid-phase working fluid $F_L$ also flows in a different direction than the extending direction X of the main groove 21 via the connection groove 22 in the second metal sheet 12 of flat shape, whereby it is possible for the liquid-phase working fluid $F_L$ to accept heat from the heat generating body 5 in a wider range of the evaporator 3. As a result thereof, since the amount of heat transport in the internal space S improves, it is possible to raise the thermal transport property of the vapor chamber 1.

In addition, as shown in FIG. 6A, the first metal sheet 11 and second metal sheet 12 may configure a plurality of spaces as the internal space S by the opposite surfaces 11a, 12a. At this time, it is preferable for the internal space S to be partitioned into the plurality of vapor flow channels R1 to R3 by contact between abutting parts 15 provided to the respective opposite surfaces 11a, 12a of the first metal sheet 11 and second metal sheet 12, and the main grooves 21 and connection grooves 22 to be arranged in a region at least including the abutting parts 15 of the opposite surface of at least one metal sheet (opposite surface 12a in FIG. 6B), as shown in FIG. 6B. In particular, the main grooves 21 and connection grooves 22 are more preferably arranged in a region including both the abutting part 15 and a portion facing the plurality of vapor flow channels R1 to R3, in the opposite surface of at least one metal sheet (opposite surface 12a in FIG. 6B). By arranging the main grooves 21 and connection grooves 22 in a region at least including the abutting part 15, the circulation of gas-phase working fluid $F_g$ is ensured by the plurality of vapor flow channels R1 to R3, and the contact area between the liquid-phase working fluid $F_L$ and the gas-phase working fluid $F_g$ is reduced by the existence of the abutting part 15. As a result thereof, it is possible make condensation of gas-phase working fluid $F_g$ by contact with the liquid-phase working fluid $F_L$ in portions other than the condenser 4, and evaporation of liquid-phase working fluid $F_L$ by contact with the gas-phase working fluid $F_g$ in a portion other than the evaporator 3 hardly occur.

The material constituting the first metal sheet 11 and second metal sheet 12 is preferably copper, copper alloy, aluminum, aluminum alloy or stainless steel, from the viewpoints such as high thermal conductivity and processing ease by laser. Thereamong, for the purpose of achieving weight reduction, aluminum and aluminum alloy are more preferably, and for the purpose of raising mechanical strength, stainless steel is more preferable. In addition, tin, tin alloy, titanium, titanium alloy, nickel, nickel alloy, etc. may be used in the first metal sheet 11 and second metal sheet 12 depending on the use environment.

Operating Principle of Vapor Chamber

Next, the operating principle of the vapor chamber 1 will be explained using FIG. 5B. Herein, the vapor chamber 1 enters a state in which the liquid-phase working fluid $F_L$ is enclosed in the internal space S prior to operation, and is supplied to the evaporator 3.

When the temperature of the evaporator 3 rises by the heat generating body 5 generating heat, the heat of the heat generating body 5 is transferred to the first metal sheet 11 and second metal sheet 12, and heat is transferred to the evaporator 3, which is in the vicinity of the heat generating body 5 of the vapor chamber 1. In the evaporator 3, the liquid-phase working fluid $F_L$ is heated and boils by the temperature rising, and phase changes from the liquid-phase working fluid $F_L$ enclosed in the internal space S and shown by blacked out arrows in FIG. 5B into the gas-phase working fluid $F_g$ shown by outlined arrows. Together with this, the heat from the heat generating body 5 is absorbed by the gas-phase working fluid $F_g$ as latent heat of vaporization, by phase change from the liquid-phase working fluid $F_L$ to gas-phase working fluid $F_g$.

The gas-phase working fluid $F_g$ absorbing the heat in the evaporator 3 flows through the upper space in the internal space S of the container 2 to the condenser 4, whereby the heat received from the heat generating body 5 is transferred from the evaporator 3 to the condenser 4.

Subsequently, the gas-phase working fluid $F_g$ transported to the condenser 4 is phase changed to the liquid phase with the condenser 4, by a heat exchange means (not illustrated). In other words, it is phase changed from the gas-phase working fluid $F_g$ shown by outlined arrows in FIG. 5B to the liquid-phase working fluid $F_L$ shown by blacked out arrows. At this time, the transferred heat of the heat generating body 5 is radiated to outside of the vapor chamber 1 as latent heat of condensation.

The liquid-phase working fluid $F_L$ having phase changed to the liquid phase by radiating heat at the condenser 4 flows from the condenser 4 through the main grooves 21 and/or connection grooves 22 to the evaporator 3, whereby it is possible to facilitate forming circulatory flow of the working fluid F between the evaporator 3 and condenser 4.

In particular, in the vapor chamber 1, since the liquid-phase working fluid $F_L$ flows in the main grooves 21 and connection grooves 22 by the capillary force acting on the liquid-phase working fluid $F_L$, for example, even if the vapor chamber 1 is any posture such as a state in which the vapor chamber 1 shown in FIGS. 1A and 1B tilts 90 degrees on the paper plane, or a state inverted vertically, it is possible to easily return the working fluid having become the liquid phase from the gas phase in the condenser 4 to the evaporator 3. Therefore, independently of the arrangement state of the vapor chamber 1, it is possible to favorably obtain circulatory flow of the liquid-phase working fluid $F_L$ and the gas-phase working fluid $F_g$.

Manufacturing Method of Vapor Chamber

Figure 7:
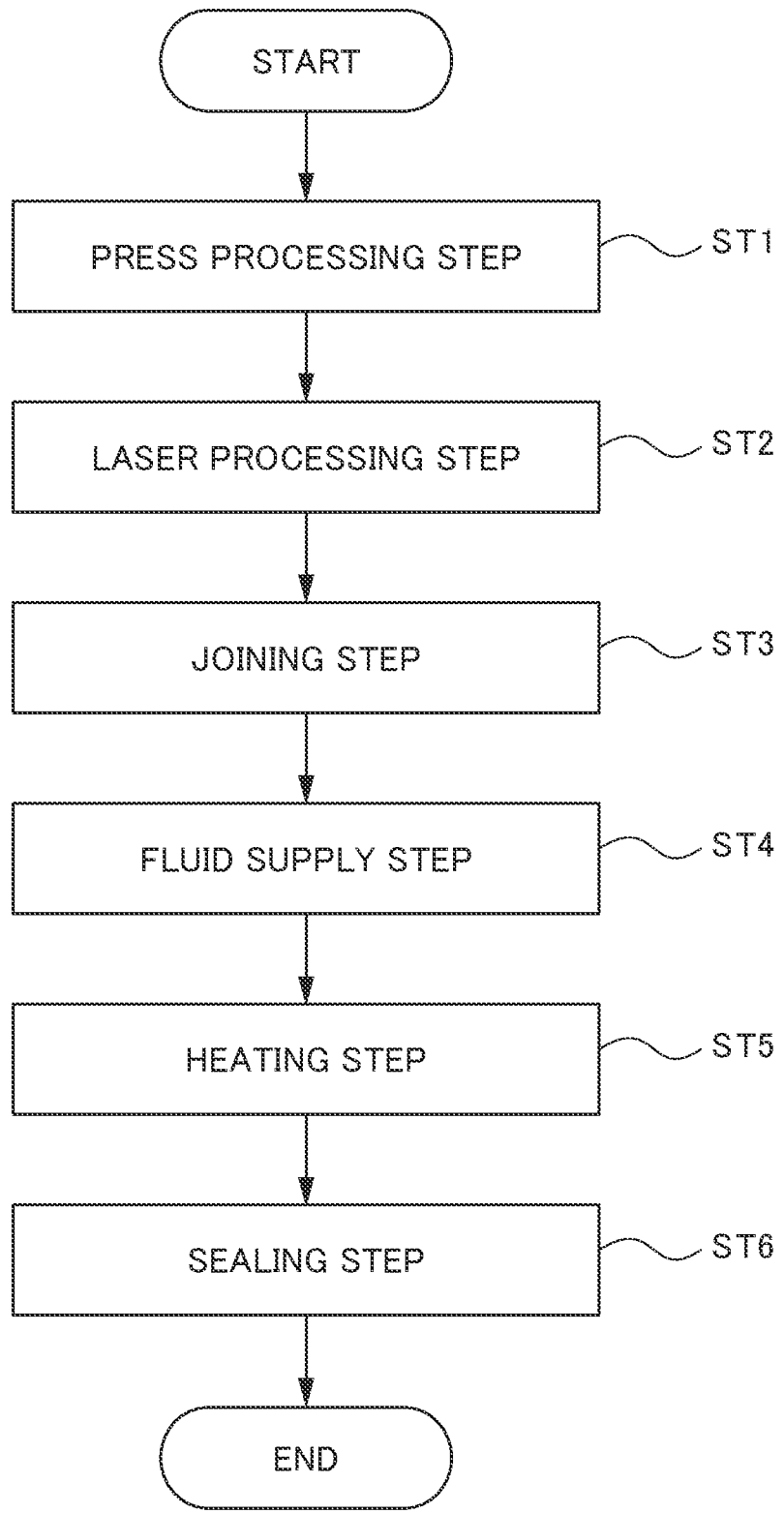
FIG. 7 is a flow diagram of a manufacturing method of the vapor chamber.

Next, the manufacturing method of the above-mentioned vapor chamber 1 will be explained. FIG. 7 is a flow diagram of the manufacturing method of the vapor chamber. This manufacturing method includes a step of forming the main grooves 21 and connection grooves 22, by irradiating a laser beam L so as to draw a line in one direction on the opposite surface of at least one metal sheet, i.e. at least one of the opposite surface 11a of the first metal sheet 11 and the opposite surface 12a of the second metal sheet 12. More specifically, this manufacturing method can include: a press processing step ST1 of press molding at least one of the first metal sheet 11 and second metal sheet 12; a laser processing step ST2 of simultaneously forming the main grooves 21 and connection grooves 22, by irradiating the laser beam L so as to draw a line in one direction on at least one of the opposite surface 11a of the first metal sheet 11 and the opposite surface 12a of the second metal sheet 12; a joining step ST3 of forming the internal space S by joining the first metal sheet 11 and second metal sheet 12; a fluid supply step ST4 of supplying the liquid-phase working fluid $F_L$ to the formed internal space S; a heating step ST5 of heating the working fluid F to change phase from the liquid phase to the gas phase; and a sealing step ST6 of sealing the internal space S in the heated state.

First, metal sheet materials 10 to become the first metal sheet 11 and second metal sheet 12 are prepared. Herein, in order to configure so that the internal space S is formed when joining the first metal sheet 11 and second metal sheet 12, the press processing step ST1 of press molding at least one of the first metal sheet 11 and second metal sheet 12 may be performed. For example, by performing the press processing step ST1 on the first metal sheet 11, it is possible to form the recess 11b such as that illustrated in FIGS. 5A and 5B.

Figure 8:
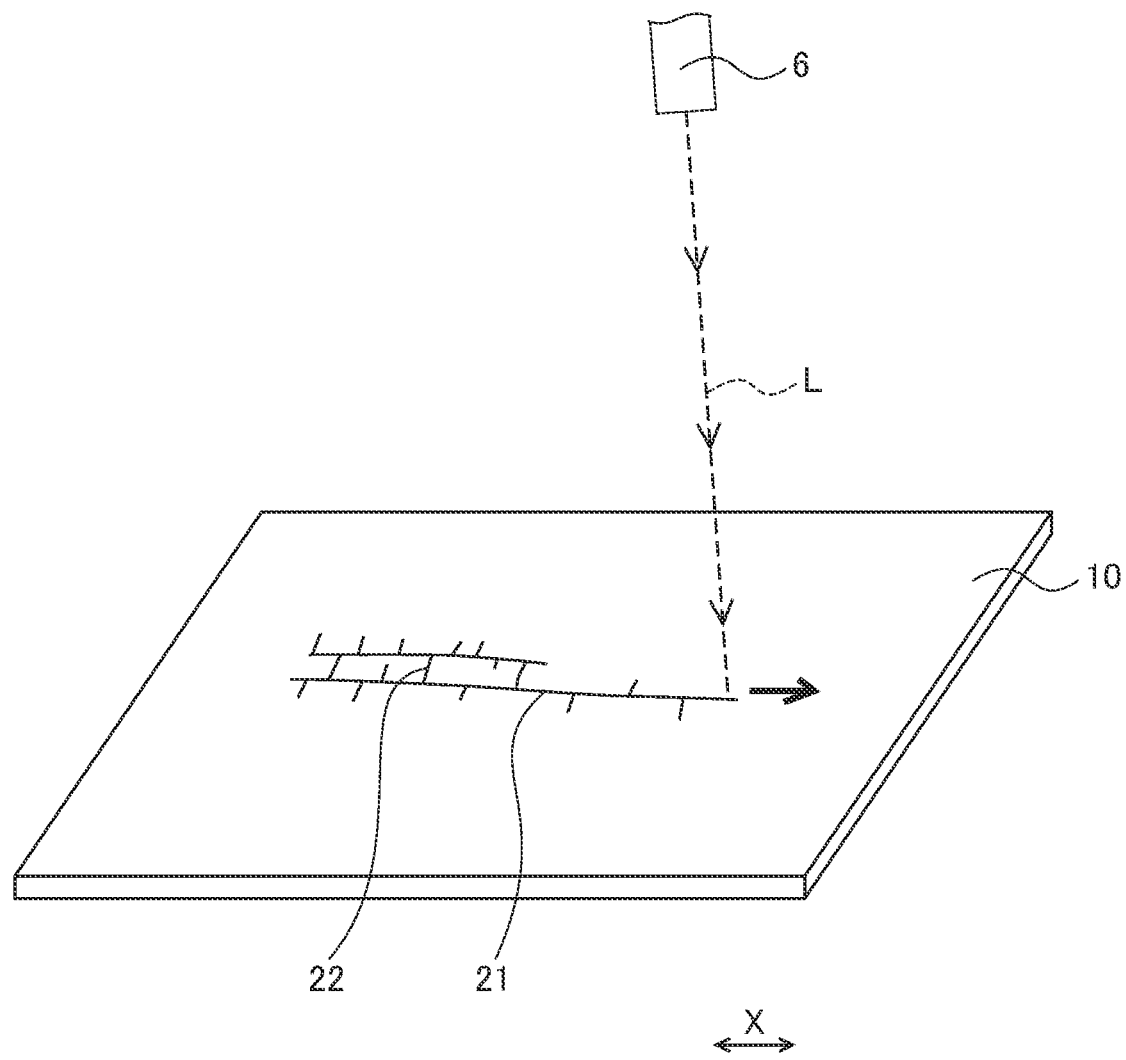
FIG. 8 is a view for explaining a manufacturing method of a vapor chamber, showing an example of a process when forming main grooves and connection grooves by irradiating a laser beam onto the surface of a metal sheet material.

FIG. 8 is a view for explaining the manufacturing method of the vapor chamber, showing an example of processes when forming the main grooves and connection grooves by irradiating a laser beam onto the surface of the metal sheet material. Next, as shown in FIG. 8, the laser processing step ST2 of simultaneously forming the main grooves 21 and connection grooves 22 is performed by irradiating the laser beam L so as to draw a line in one direction from the laser source 6 onto the surface to become the opposite surface of at least one metal sheet among the opposite surface 11a of the first metal sheet 11 and the opposite surface 12a of the second metal sheet 12 of the metal sheet materials 10. In this laser processing step ST2, from the viewpoint of the process controllability and processability in a short time being more superior, it is preferable to form the main grooves 21 and connection grooves 22 using a fiber laser.

In the laser processing step ST2, upon forming the main groove 21 so as to draw a line in one direction, the processed region having unevenness is formed in the vicinity of the formed main groove 21. Therefore, upon forming adjacent main grooves 21, by performing laser processing so that processed regions having unevenness are adjacent to each other, it is possible to simultaneously form the connection grooves 22 with the main grooves 21, by the recesses of the processed region being in communication. As a result thereof, the connection groove 22 extending in a different direction from the extending direction X of the main groove 21, i.e. connection groove 22 extending in a direction traversing at least two adjacent main grooves 21, can be formed in a short time.

After performing the laser processing step ST2, the joining step ST3 is performed of arranging the opposite surface 11a of the first metal sheet 11 and the opposite surface 12a of the second metal sheet 12 so as to face each other, joining the first metal sheet 11 and second metal sheet 12 over the entire periphery except a portion which becomes an inlet of the liquid-phase working fluid $F_L$, and forming the internal space S surrounded by the joint 13 formed by the joining.

In the joining step ST3, it is preferable to weld the first metal sheet 11 and second metal sheet 12 by laser. By welding the first metal sheet 11 and second metal sheet 12 by laser, it is possible to rapidly locally heat the first metal sheet 11 and second metal sheet 12 to weld following the laser processing step of forming the main grooves 21 and connection grooves 22. Compared to conventional diffusion bonding, since the time required in heating, heat maintaining, cooling, etc. becomes a short time, it is thereby possible to more efficiently manufacture the vapor chamber 1 having the main grooves 21 and connection grooves 22. In addition, contrary to the conventionally used diffusion bonding, since only the vicinity of the portion irradiated by the laser is heated, in addition to being able to form the main grooves 21 and connection grooves 22 in a short time, it is possible to curb a decline in mechanical strength due to unintended annealing of the vapor chamber 1.

Next, in the fluid supply step ST4, the liquid-phase working fluid $F_L$ is supplied to the internal space S from the inlet of the liquid-phase working fluid $F_L$. Herein, the means for supplying the liquid-phase working fluid $F_L$ can employ a known means capable of forcing through a liquid into a narrow gap, such as a syringe or hypodermic needle.

After supplying the liquid-phase working fluid $F_L$ to the internal space S of the container 2 in the fluid supply step ST4, the heating step ST5 is performed of heating the liquid-phase working fluid $F_L$ to phase change from the liquid-phase working fluid $F_L$ to the gas-phase working fluid $F_g$. At this time, gas such as air contained in the internal space S is pushed out to be degassed, by the gas-phase working fluid $F_g$ generated by phase change. In this state, it is possible to obtain the vapor chamber 1, by performing the sealing step ST6 of sealing the internal space S by joining the portion which becomes the inlet of the liquid-phase working fluid $F_L$ of the first metal sheet 11 and second metal sheet 12.

The above-mentioned vapor chamber 1 is suitably used in electronic devices such as mobile phones, for which favorable thermal transport property is sought, even at various postures. The electronic device equipped with the vapor chamber 1 has the high thermal transport property of the vapor chamber 1, even in various usage states.

According to the above explained embodiments, the working fluid $F_L$ which becomes the liquid phase in the condenser 4 can efficiently circulate on the opposite surfaces 11a, 12a in which the main grooves 21 and connection grooves 22 are provided; therefore, it is possible to improve the transfer efficiency of latent heat via the vapor chamber 1. For this reason, the vapor chamber 1 can improve the transport efficiency of working fluid, and bring about superior thermal transport property.

It should be noted that the above description shows an example mounting the heat generating body 5 to the second metal sheet 12; however, the heat generating body 5 may be mounted to the first metal sheet 11.

In addition, although the above description shows an example of providing the main grooves 21 and connection grooves 22 in the opposite surface 12a of the second metal sheet 12, the main grooves 21 and connection grooves 22 may be provided to the opposite surface 11a of the first metal sheet 11 in addition to the opposite surface 12a of the second metal sheet 12. In particular, by providing the main grooves 21 and connection grooves 22 in both the first metal sheet 11 and second metal sheet 12, it is possible to further improve the thermal transport property of the vapor chamber 1.

In addition, although the above description shows an example in which the second metal sheet 12 is a flat shape, and the first metal sheet 11 provides the recess 11*b* partitioning to form the internal space S, the recess partitioning to form the internal space S may be provided in both the first metal sheet 11 and second metal sheet 12.

Although an embodiment of the present invention has been explained above, the present invention encompasses all aspects included in the gist of the present disclosure and the claims without being limited to the above-mentioned embodiment, and can be modified in various ways within the scope of the present disclosure.

EXPLANATION OF REFERENCE NUMERALS 1 vapor chamber
10 metal sheet material
11 first metal sheet
12 second metal sheet
11*a* surface of first metal sheet facing second metal sheet (opposite surface)
12*a* surface of second metal sheet facing first metal sheet (opposite surface)
13 joint
14, 14*a*, 14*b*, 14*b*', 14*c* micro-uneven surface
15 abutting part
21, 21*a* to 21*d* main groove
21*e* groove bottom of main groove
21*f*, 21*f*' inner wall surface of main groove
22, 22*a*, 22*b* connection groove
22*c* groove bottom of connection groove
22*d*, 22*d*' inner wall surface of connection groove
3 evaporator
4 condenser
5 heat generating body
6 laser source
$F_L$ liquid-phase working fluid
$F_g$ gas-phase working fluid
R1, R2, R3 vapor flow channel
S internal space
$h_1$ height dimension of unevenness of micro-uneven surface 14*a*
$h_2$ height dimension of unevenness of micro-uneven surface 14*b*
$h_2$' height dimension of unevenness of micro-uneven surface 14*b*'
$h_3$ height dimension of unevenness of micro-uneven surface 14*c*
$d_1$ groove depth dimension of main groove
$d_2$ groove depth dimension of connection groove
$w_1$ groove width dimension of main groove
$w_2$ groove width dimension of connection groove
$p_1$ arrangement pitch of main groove
$p_2$ arrangement pitch of connection groove
X extending direction of main groove
Y groove width direction of main groove
Y' width direction of internal space
θ angle relative to extending direction of main groove
L laser beam
ST1 press processing step
ST2 laser processing step
ST3 joining step
ST4 fluid supply step
ST5 heating step
ST6 sealing step

The invention claimed is:

1. A vapor chamber comprising a working fluid in a sealed internal space formed by joining a first metal sheet and a second metal sheet, wherein, in an opposite surface of at least one metal sheet of the first metal sheet and the second metal sheet, among opposite surfaces at which the first metal sheet and the second metal sheet are facing each other, main grooves extending continuously or discontinuously towards one direction are formed in line at a predetermined interval, and connection grooves connecting main grooves which are adjacent are formed at irregular arrangement pitches and irregular grooves widths toward a different direction than the one direction, the connection grooves are such that angles relative to a direction in which the main grooves extend differ, the irregular arrangement pitches are such that, for all of the connection grooves present within an area of 10 mm height×10 mm width on the surface where the connection grooves are formed, when an arrangement pitch between adjacent connection grooves is determined by an average of both ends, a standard deviation of the arrangement pitches is at least 10% relative to an average value of the arrangement pitches, and the irregular grooves widths are such that, for all of the connection grooves present within an area of 10 mm height×10 mm width on the surface where the connection grooves are formed, when groove width dimensions are determined, a standard deviation of determined groove width dimensions is at least 10% relative to an average value of the determined groove width dimensions.

2. The vapor chamber according to claim 1, further comprising an evaporator which evaporates the working fluid, and a condenser arranged at a position separated from the evaporator and which condenses the working fluid, wherein at least part of the main grooves configure a flow channel in which the working fluid of liquid phase refluxes from the condenser toward the evaporator, and wherein the internal space configures a flow channel of the working fluid of gas phase from the evaporator toward the condenser.

3. The vapor chamber according to claim 1, wherein an opposite surface of the first metal sheet has a recess partitioning to form the internal space, wherein the second metal sheet is a flat shape at least at the evaporator, and wherein the main grooves are arranged in line at least in an opposite surface of the second metal sheet.

4. The vapor chamber according to claim 1, wherein the main grooves have a larger groove depth dimension than groove width dimension.

5. The vapor chamber according to claim 1, wherein a micro-uneven surface having unevenness of a dimension smaller than a groove depth dimension of the main grooves are further formed in an inner surface of the main grooves, and on a portion of the opposite surface of the at least one metal sheet demarcated by the main groove and the connection groove.

6. The vapor chamber according to claim 1, wherein the main grooves have an arrangement pitch in a range of at least 100 μm and no more than 250 μm.

7. The vapor chamber according to claim 1, wherein the main grooves have a groove width in a range of at least 10 μm and no more than 100 μm, and wherein the main grooves have a groove depth in a range of at least 10 μm and no more than 1000 μm.

8. The vapor chamber according to claim 1, wherein the connection grooves have a groove width in a range of at least 5 μm and no more than 100 μm, and wherein the connection grooves have a groove depth in a range of at least 10 μm and no more than 1000 μm.

9. The vapor chamber according to claim 1, wherein the internal space is partitioned into a plurality of vapor flow channels by contact between abutting parts provided in the opposite surfaces of each of the first metal sheet and the second metal sheet, and wherein the main grooves and the connection grooves are arranged in a region at least including the abutting part of the opposite surface of the at least one metal sheet.

10. A manufacturing method of the vapor chamber according to claim 1, the method comprising forming the main grooves and the connection grooves by irradiating a laser beam so as to draw a line in one direction onto the opposite surface of the at least one metal sheet.

11. The vapor chamber according to claim 2, wherein an opposite surface of the first metal sheet has a recess partitioning to form the internal space, wherein the second metal sheet is a flat shape at least at the evaporator, and wherein the main grooves are arranged in line at least in an opposite surface of the second metal sheet.

12. The vapor chamber according to claim 2, wherein the main grooves have a larger groove depth dimension than groove width dimension.

13. The vapor chamber according to claim 2, wherein a micro-uneven surface having unevenness of a dimension smaller than a groove depth dimension of the main grooves are further formed in an inner surface of the main groove, and a portion of the opposite surface of the at least one metal sheet demarcated by the main groove and the connection groove.

14. The vapor chamber according to claim 2, wherein the main grooves have an arrangement pitch in a range of at least 100 μm and no more than 250 μm.

15. The vapor chamber according to claim 2, wherein the main grooves have a groove width in a range of at least 10 μm and no more than 100 μm, and wherein the main grooves have a groove depth in a range of at least 10 μm and no more than 1000 μm.

16. The vapor chamber according to claim 2, wherein the connection grooves have a groove width in a range of at least 5 μm and no more than 100 μm, and wherein the connection grooves have a groove depth in a range of at least 10 μm and no more than 1000 μm.

17. The vapor chamber according to claim 2, wherein the internal space is partitioned into a plurality of vapor flow channels by contact between abutting parts provided in the opposite surfaces of each of the first metal sheet and the second metal sheet, and wherein the main grooves and the connection grooves are arranged in a region at least including the abutting part of the opposite surface of the at least one metal sheet.

18. A manufacturing method of the vapor chamber according to claim 2, the method comprising forming the main grooves and the connection grooves by irradiating a laser beam so as to draw a line in one direction onto the opposite surface of the at least one metal sheet.

19. The vapor chamber according to claim 3, wherein the main grooves have a larger groove depth dimension than groove width dimension.

20. The vapor chamber according to claim 3, wherein a micro-uneven surface having unevenness of a dimension smaller than a groove depth dimension of the main grooves have further formed in an inner surface of the main grooves, and on a portion of the opposite surface of the at least one metal sheet demarcated by the main grooves and the connection grooves.

* * * * *